United States Patent [19]
Morris

[11] Patent Number: 5,227,332
[45] Date of Patent: Jul. 13, 1993

[54] METHODS OF PLATING INTO HOLES AND PRODUCTS PRODUCED THEREBY

[75] Inventor: Neil Morris, Guildford, England

[73] Assignee: LSI Logic Corporation, Milpitas, Calif.

[21] Appl. No.: 730,817

[22] PCT Filed: Nov. 30, 1990

[86] PCT No.: PCT/GB90/01869
§ 371 Date: Jul. 25, 1991
§ 102(e) Date: Jul. 25, 1991

[87] PCT Pub. No.: WO91/08586
PCT Pub. Date: Jun. 13, 1991

[30] Foreign Application Priority Data

Dec. 2, 1989 [GB] United Kingdom ............... 8927310

[51] Int. Cl.$^5$ .................... H01L 21/441; B05D 5/12
[52] U.S. Cl. .................... 437/187; 437/230; 437/189; 437/194; 257/753; 257/765; 257/768; 427/98; 427/438

[58] Field of Search ............. 437/230, 187; 357/67 S, 357/71; 427/438, 305, 98; 257/753, 765, 768

[56] References Cited

U.S. PATENT DOCUMENTS 3,415,679 12/1968 Chuss ............................. 437/230 X
4,316,209 2/1982 Ho et al. ........................ 357/67 S

FOREIGN PATENT DOCUMENTS 3125730 1/1983 Fed. Rep. of Germany ...... 437/230
298136 12/1987 Japan ................................. 437/230
144653 6/1989 Japan ................................. 437/230

*Primary Examiner*—John S. Maples
*Attorney, Agent, or Firm*—Gerald E. Linden; Michael D. Rostoker

[57] ABSTRACT

In the plating of articles, particularly the filling of via-holes (16) in the manufacture of semiconductor devices, a catalyst, for example palladium, is incorporated throughout the body of material (12) to which plating is to be effected, as compared with activating just the surface of the body.

18 Claims, 1 Drawing Sheet

METHODS OF PLATING INTO HOLES AND PRODUCTS PRODUCED THEREBY

This invention relates to methods of plating into holes and to products produced thereby. It is particularly concerned with the manufacture of semiconductor devices and circuits. The invention is more particularly concerned with methods of via-hole filling and with improved semiconductor devices produced using such methods.

Multilevel interconnection technology is indispensable for fabricating complex circuits in semiconductor devices. This involves the creation of via-holes which are subsequently filled. Various methods are known for via-hole filling, but in many cases the reliability is poor.

In one known method of via-hole filling, an electroless nickel plating method is used. An aluminium film is patterned onto a silicon substrate, and a film of phosphosilicate glass (PSG) is deposited on the aluminium pattern as an insulator. Via-holes are formed through the glass film using for example a reactive ion etching method. Then, the bottom surface of the via-hole is activated for subsequent electroless plating using either a "wet" method or a "lift-off" method. In the wet method, the sample is immersed in palladium chloride solution which results in a substitution reaction with only the bottom surface of the via-hole being selectively activated. In the lift-off method on the other hand, palladium is vacuum evaporated in the via-hole so that both the side wall and also the bottom surface of the via-hole are selectively activated. Following either method, electroless nickel plating is carried out in the via-hole. However, these known methods are not wholly satisfactory. With the "wet" method, although a flat surface can generally be obtained for the nickel in the via-hole if the hole is relatively large in diameter, problems arise in the case of small holes. With the lift-off method on the other hand it is difficult to obtain a planar surface at the top of the via-hole.

It is an object of the present invention to provide an improved method of plating, especially for via-hole filling, which has greater reliability and which is particularly suited for electroless plating.

Broadly in accordance with the present invention this is achieved by providing a catalyst within the material to which one wishes to plate, as compared with activating just the surface.

In accordance with the invention there is provided a method of filling a hole of a semiconductor device which comprises depositing on a substrate a body of material which incorporates throughout a catalyst appropriate to a metal subsequently to be plated to the surface thereof, forming an insulation layer on said body, forming a hole through said insulation layer, and depositing the plating metal to fill the hole.

Also in accordance with the invention there is provided a semiconductor device comprising a substrate, a body of material on the substrate which incorporates throughout a catalyst appropriate to a metal to be plated to the surface thereof, an insulation layer on said body having at least one hole therethrough, and a plating metal filling said hole or holes.

It has been found that the incorporation of such a catalyst within the material to which one wishes to plate greatly improves the suitability of the material for subsequent plating, as compared for example with the conventional techniques of activating the bottom surface or the bottom surface and side wall of the hole. One is taking a base material which is not inherently a catalyst and adding something which serves as a catalyst to enable plating to take place.

Preferably, palladium is used as a catalyst, especially for nickel plating, in a concentration appropriate to the particular materials and structure used. However, it is to be understood that materials other than palladium can be used as catalysts, either singly or in combinations.

The film or layer to which one wishes to plate can be any material to which one might wish to plate. Normally this would be a metal or a semiconductor material. Aluminium, aluminium alloys, silicon, aluminium/silicon and titanium are examples of materials which are appropriate for use in the case of subsequent electroless plating with nickel.

BRIEF DESCRIPTION OF THE DRAWINGS

The accompanying drawing (FIGS. 1 and 2; which are cross-sectional views) shows one embodiment of the method according to the invention, by way of example, applied to the filling of a via-hole of an integrated circuit.

DETAILED DESCRIPTION OF THE INVENTION

Figure 1:
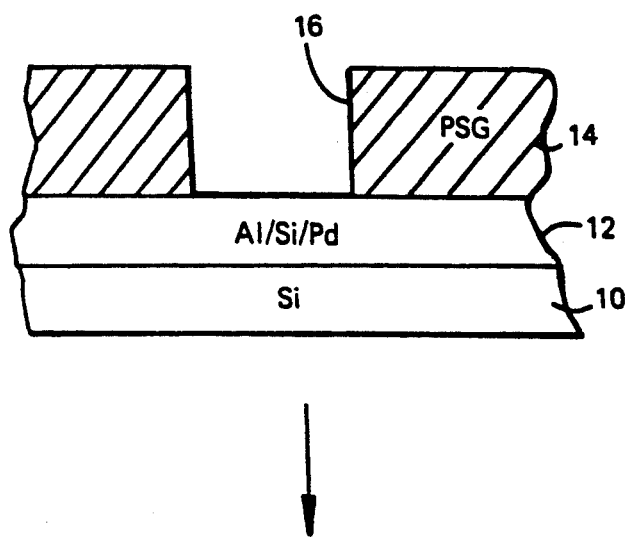
Figure 2:
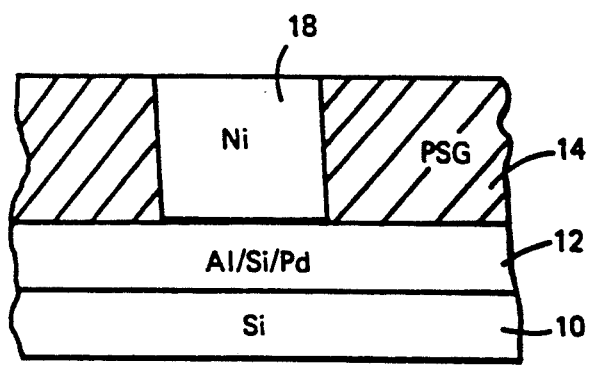

As shown in the drawing (FIG. 1), on a substrate 10 of silicon is deposited a film or layer 12 of an alloy which in this embodiment is shown as being an alloy of aluminium, silicon and palladium. The concentration of palladium in the alloy will vary as circumstances demand. A film 14 of phosphosilicate glass (PSG) is deposited on the film layer 12 as an interlayer insulator. A via-hole 16 is formed through the glass 14, for example using an etching method. In accordance with the invention, the via-hole 16 is then immediately ready for subsequent electroless plating, for example with nickel (FIG. 2), to provide a via-hole filling 18. Due to the presence of the catalyst, here palladium, in the film layer 12, the plating process is accomplished with great reliability and in a manner which is highly effective.

As mentioned above, the catalyst which is provided throughout the film layer 12 may be any material or combination of materials which will facilitate the subsequent plating through the hole, and palladium is just one preferred material for such purposes.

The layer 12 to which the plating is effected may be any material to which one might wish to plate. Normally this would be a metal, a metal alloy or a semiconductor material. Examples are aluminium, alloys of aluminium, silicon and its associated materials, aluminium/silicon and titanium. However, other materials could be used.

I claim:

1. A method of filling a hole of a semiconductor device comprising:
   depositing on a substrate a first layer of material which first layer incorporates throughout a catalyst suited to facilitate the plating of a plating metal subsequently to be plated to the surface of the first layer;
   forming an insulation layer over the first layer; forming a hole through said insulation layer; and depositing the plating metal to fill the hole.
2. A method as claimed in claim 1, wherein:
   the catalyst is palladium.
3. A method according to claim 1, wherein:

the first layer of material includes aluminum, an aluminum alloy, silicon, aluminum/silicon or titanium.

4. A method according to claim 1, wherein:
the hole is a via-hole.

5. A semiconductor device comprising:
a substrate,
a first layer of material on the substrate which first layer incorporates throughout a catalyst suited to facilitating the plating of a plating metal to be plated to the surface of the first layer;
an insulation layer disposed over the first layer and having at least one hole therethrough, and
plating metal filling said at least one hole.

6. A semiconductor device as claimed in claim 5, wherein:
the first layer of material is aluminum, an aluminum alloy, silicon, aluminum/silicon or titanium.

7. A semiconductor device according to claim 5, wherein:
the catalyst is palladium.

8. A semiconductor device according to claim 5, wherein:
the plating metal is nickel.

9. A semiconductor device according to claim 5, wherein:
each at least one hole is a via-hole.

10. A method according to claim 2, wherein:
the first layer of material is aluminum, an aluminum alloy, silicon, aluminum/silicon or titanium.

11. A method according to claim 2, wherein:
the hole is a via-hole.

12. A method according to claim 3, wherein:
the hole is a via-hole.

13. A semiconductor device according to claim 6, wherein:
the catalyst is palladium.

14. A semiconductor device according to claim 6, wherein:
the plating metal is nickel.

15. A semiconductor device according to claim 7, wherein:
the plating metal is nickel.

16. A semiconductor device according to claim 6, wherein:
each at least one hole is a via-hole.

17. A semiconductor device according to claim 7, wherein:
each at least one hole is a via-hole.

18. A semiconductor device according to claim 8, wherein:
each at least one hole is a via-hole.

* * * * *